(12) United States Patent
Park

(10) Patent No.: US 10,110,236 B2
(45) Date of Patent: Oct. 23, 2018

(54) APPARATUS FOR RECOGNIZING PULSE SIGNAL

(71) Applicant: LSIS CO., LTD., Gyeonggi-do (KR)

(72) Inventor: Kang-Hee Park, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/463,777

(22) Filed: Mar. 20, 2017

(65) Prior Publication Data
US 2018/0109261 A1    Apr. 19, 2018

(30) Foreign Application Priority Data
Oct. 14, 2016    (KR) .......................... 10-2016-0133294

(51) Int. Cl.
*H03K 19/177*    (2006.01)
*G05B 19/05*    (2006.01)

(52) U.S. Cl.
CPC ....... *H03K 19/1774* (2013.01); *G05B 19/054* (2013.01); *H03K 19/1776* (2013.01); *H03K 19/17744* (2013.01); *G05B 2219/1164* (2013.01); *G05B 2219/1176* (2013.01)

(58) Field of Classification Search
CPC ......... H03K 19/1774; H03K 19/17744; H03K 19/1776
USPC .......................................................... 326/41
See application file for complete search history.

(56) References Cited

U.S. PATENT DOCUMENTS

| 5,008,802 A | 4/1991 | Itoh et al. |
| 6,574,743 B1 | 6/2003 | Boggs et al. |
| 6,904,471 B2 | 6/2005 | Boggs et al. |
| 2015/0105868 A1* | 4/2015 | Sin .................... G05B 19/05 700/7 |

FOREIGN PATENT DOCUMENTS

| EP | 0447776 A1 | 9/1991 | |
| EP | 0447776 A2 * | 9/1991 | ........... G05B 19/054 |

(Continued)

OTHER PUBLICATIONS

European Search Report for related European Application No. 17161326.8; report dated Oct. 25, 2017; (8 pages).

(Continued)

*Primary Examiner* — Dylan C White
(74) *Attorney, Agent, or Firm* — K&L Gates LLP

(57) ABSTRACT

The present disclosure relates to an apparatus for recognizing a pulse signal, and more particularly, to an apparatus for recognizing a pulse signal, which maintains the pulse signal being input for a scan time until an end time point of the scan time, and stores the pulse signal in a pulse signal storage area as pulse input data. The apparatus for recognizing a pulse signal according to one embodiment of the present disclosure includes a signal maintaining unit configured to maintain and output the pulse signal, which is input for the scan time, as a pulse maintaining signal; a signal transmission unit configured to receive the pulse maintaining signal from the signal maintaining unit and transmit the input pulse maintaining signal; and a control unit configured to output the transmission control signal to the signal transmission unit to receive and store the received pulse maintaining signal.

5 Claims, 9 Drawing Sheets

(56) References Cited

FOREIGN PATENT DOCUMENTS

| | | | |
|---|---|---|---|
| JP | 60-238902 | A | 11/1985 |
| JP | 04-085924 | U1 | 7/1992 |
| JP | H052412 | A | 1/1993 |
| JP | 05-030905 | U | 4/1993 |
| JP | 05-289714 | | 5/1993 |
| JP | 2001202110 | A | 7/2001 |
| JP | 2002163008 | A | 6/2002 |
| KR | 100972509 | B1 | 7/2010 |

OTHER PUBLICATIONS

Japanese Office Action for related Japanese Application No. 2017-056472; action dated Nov. 28, 2017; (5 pages).

* cited by examiner

PRIOR ART

PRIOR ART

PRIOR ART

APPARATUS FOR RECOGNIZING PULSE SIGNAL

CROSS-REFERENCE TO RELATED APPLICATIONS

This application claims the priority of Korean Patent Application No. 10-2016-0133294 filed on Oct. 14, 2016, in the Korean Intellectual Property Office, the disclosure of which is hereby incorporated by reference in its entirety.

BACKGROUND

1. Technical Field

The present disclosure relates to an apparatus for recognizing a pulse signal, and more particularly, to an apparatus for recognizing a pulse signal, which maintains the pulse signal being input for a scan time until an end time of the scan time, and thus stores the pulse signal as pulse input data at a pulse signal storage area.

2. Description of the Related Art

A programmable logic controller (PLC) device is a programmable logic device and typically serves as a computer. It receives a signal from equipment and processes the signal according to programmed contexts inside the PLC device, thereby outputting a processed signal to the equipment.

More particularly, the PLC device executes a scan program, which is programmed by a user, one time from start to finish and performs an operation processing on the execution result of the scan program. Here, a procedure in which the PLC device executes the scan program one time and performs the operation processing on the execution result of the scan program refers to a scan. That is, the PLC device repetitively performs a one time execution procedure for a scan time.

Generally, the PLC device performs a batch process on an input signal input from equipment and an output signal output thereto at a time in which a scan time is terminated. Therefore, there is a problem in that the PLC device does not recognize a pulse signal which is input for a short time in the middle of the scan time.

To address such a problem, a conventional PLC device is provided with an interrupt port at an internal micro process unit (MPU), and connects a pulse signal input circuit to the interrupt port to generate an interrupt signal when a pulse signal is input, thereby recognizing the pulse signal.

FIG. 1 is a circuit diagram of a conventional PLC device provided with a pulse signal input circuit.

Referring to FIG. 1, a plurality of interrupt ports A1, . . . , and An are provided at an MPU A, and a plurality of input terminals B1, . . . , and Bn, to which pulse signals are input, and the plurality of interrupt ports A1, . . . , and An are respectively connected to each other through a plurality of pulse signal input circuits C1, . . . , and Cn in a non-conducting state.

The plurality of pulse signal input circuits C1, . . . , and Cn respectively include optical couplers C1-1, . . . , and Cn-1, each of which maintains a non-conducting state and then is conducting when a signal is input, thereby outputting the input signal.

The plurality of pulse signal input circuits C1, . . . , and Cn convert pulse signals, which are input to the plurality of input terminals B1, . . . , and Bn, into a complementary metal-oxide semiconductor (CMOS) level to output the converted pulse signals to the plurality of interrupt ports A1, . . . , and An.

FIG. 2 is a flow chart illustrating a procedure in which the PLC device provided with a pulse signal input circuit recognizes a pulse signal, and FIG. 3 is a timing diagram between a pulse signal being input for a scan time and pulse input data stored at a pulse signal storage area.

Referring to FIGS. 2 and 3, before repetitively performing a scan, an MPU of the PLC device firstly initializes inputs/outputs and a memory in Operation S1. Thereafter, the MPU executes a scan program from a first stage to an $n^{th}$ stage, thereby completing one time scan in Operation S2. At this point, when a pulse signal P1 is input to an interrupt port in the middle of a scan time in which a scan program is executed, the MPU suspends the scan program and temporarily stores an input state of the pulse signal P1 in a buffer in Operation S2-1.

Afterward, the MPU returns to the scan program to continuously execute the scan program at the suspended point in Operation S2. When a pulse signal P2 is input again to the interrupt port before the $N^{th}$ stage of the scan program is completed, the MPU suspends the scan program and temporarily stores an input state of the pulse signal P2 in the buffer in Operation S2-2.

After temporarily storing the input state of the pulse signal P2 in the buffer, the MPU returns to the scan program and then completes execution up to the $N^{th}$e stage of the scan program in Operation S2.

While completing the execution of the scan program from the first stage to the $N^{th}$ stage, the MPU stores the input states of the pulse signals P1 and P2, which are stored in the buffer as inputs of the pulse signals P1 and P2, in a pulse signal storage area as pulse input data in Operation S3.

Lastly, the MPU completes one time scan by initializing the input states of the pulse signals P1 and P2, which are stored in the buffer, in Operation S4, and then returns to Operation S1, which is described above, to repetitively perform the scan. At this point, the pulse input data, which is stored in the pulse signal storage area, is maintained for a next scan time and is updated to the scan program.

As described above, when a pulse signal is input for a scan time, the conventional PLC device suspends a scan program, which is currently executed, performs a procedure of storing an input state of the input pulse signal in a buffer, and then returns to the scan program to resume the execution of the scan program.

Consequently, the conventional PLC device performs a procedure of storing an input state of a pulse signal in a buffer whenever the pulse signal is input so that there is a problem in that a scan time for performing a scan is inevitably increased as an input of the pulse signal is increased.

Also, the conventional PLC device should be provided with an interrupt port, which is configured to generate an interrupt signal when a pulse signal is input, at the MPU having a limited dimension so that there is a problem in that the number of input contact points of pulse signals is limited.

SUMMARY

It is an object of the present disclosure to provide an apparatus for recognizing a pulse signal, which maintains a pulse signal being input for a scan time and outputs the input pulse signal as a pulse maintaining signal, thereby being capable of maintaining an input state of a pulse signal, which is input for a time shorter than the scan time, up to a time in which the scan time is terminated.

Also, it is another object of the present disclosure to provide an apparatus for recognizing a pulse signal, which is capable of recognizing a pulse signal without suspending a scan program whenever the pulse signal is input by storing a pulse maintaining signal in a pulse signal storage area as pulse input data at a termination time of a scan time.

Objects of the present disclosure are not limited to the above described objects, and other objects and advantages of the present disclosure, which are not mentioned, can be understood by the following description and also it will be apparently understood through embodiments of the present disclosure. It is also to be easily understood that the objects and advantages of the present disclosure may be realized and attained by means and a combination thereof described in the appended claims.

To attain such object, the apparatus for recognizing a pulse signal includes a signal maintaining unit configured to maintain and output the pulse signal, which is input for the scan time, as a pulse maintaining signal; a signal transmission unit configured to receive the pulse maintaining signal from the signal maintaining unit and transmit the input pulse maintaining signal based on a transmission control signal; and a control unit configured to output the transmission control signal to the signal transmission unit to receive the pulse maintaining signal, and store the received pulse maintaining signal in a pulse signal storage area as pulse input data. The apparatus for recognizing a pulse signal according to one embodiment of the present disclosure includes a signal maintaining unit configured to maintain and output the pulse signal, which is input for the scan time, as a pulse maintaining signal; a signal transmission unit configured to receive the pulse maintaining signal from the signal maintaining unit and transmit the input pulse maintaining signal based on a transmission control signal; and a control unit configured to output the transmission control signal to the signal transmission unit to receive the pulse maintaining signal, and store the received pulse maintaining signal in a pulse signal storage area as pulse input data.

In accordance with the present disclosure as described above, there is an effect in which a pulse signal being input for a scan time may be maintained and output as a pulse maintaining signal so that an input state of a pulse signal, which is input for a time shorter than the scan time, may be maintained up to a time in which the scan time is terminated.

Also, in accordance with the present disclosure, there is an effect in which a pulse maintaining signal may be stored in a pulse signal storage area as pulse input data at a termination time of a scan time so that a pulse signal may be recognized without suspending a scan program whenever the pulse signal is input.

DETAILED DESCRIPTION

Figure 1:
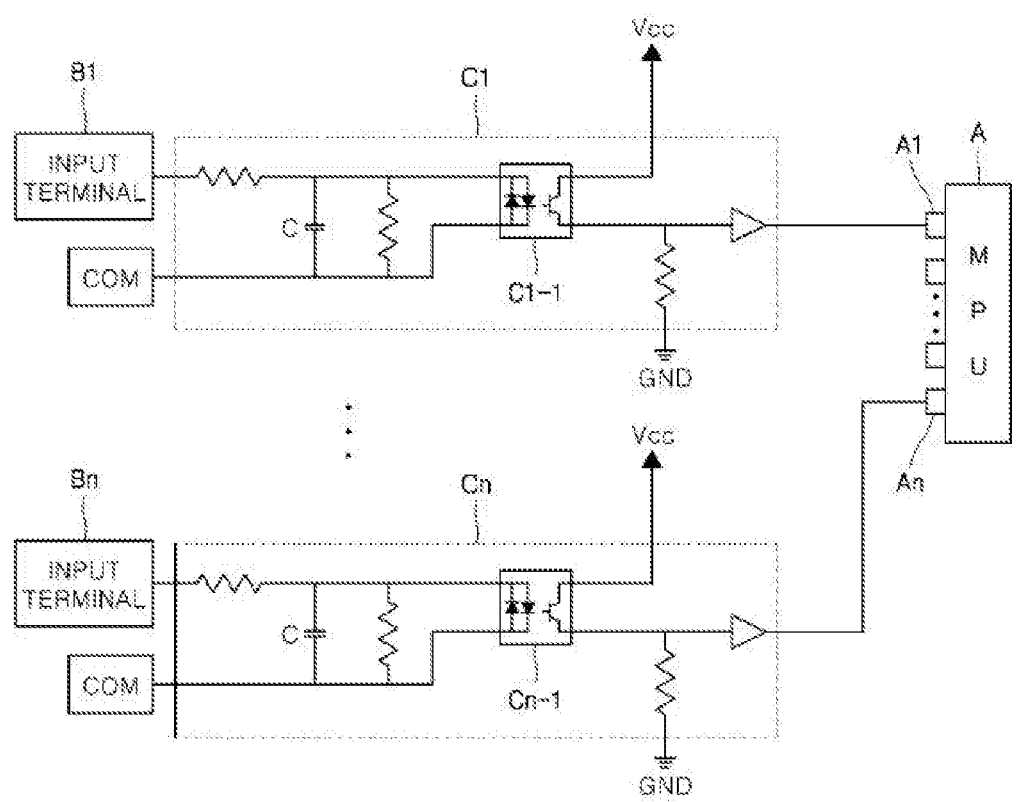
FIG. 1 is a circuit diagram of a conventional PLC device provided with a pulse signal input circuit.
Figure 2:
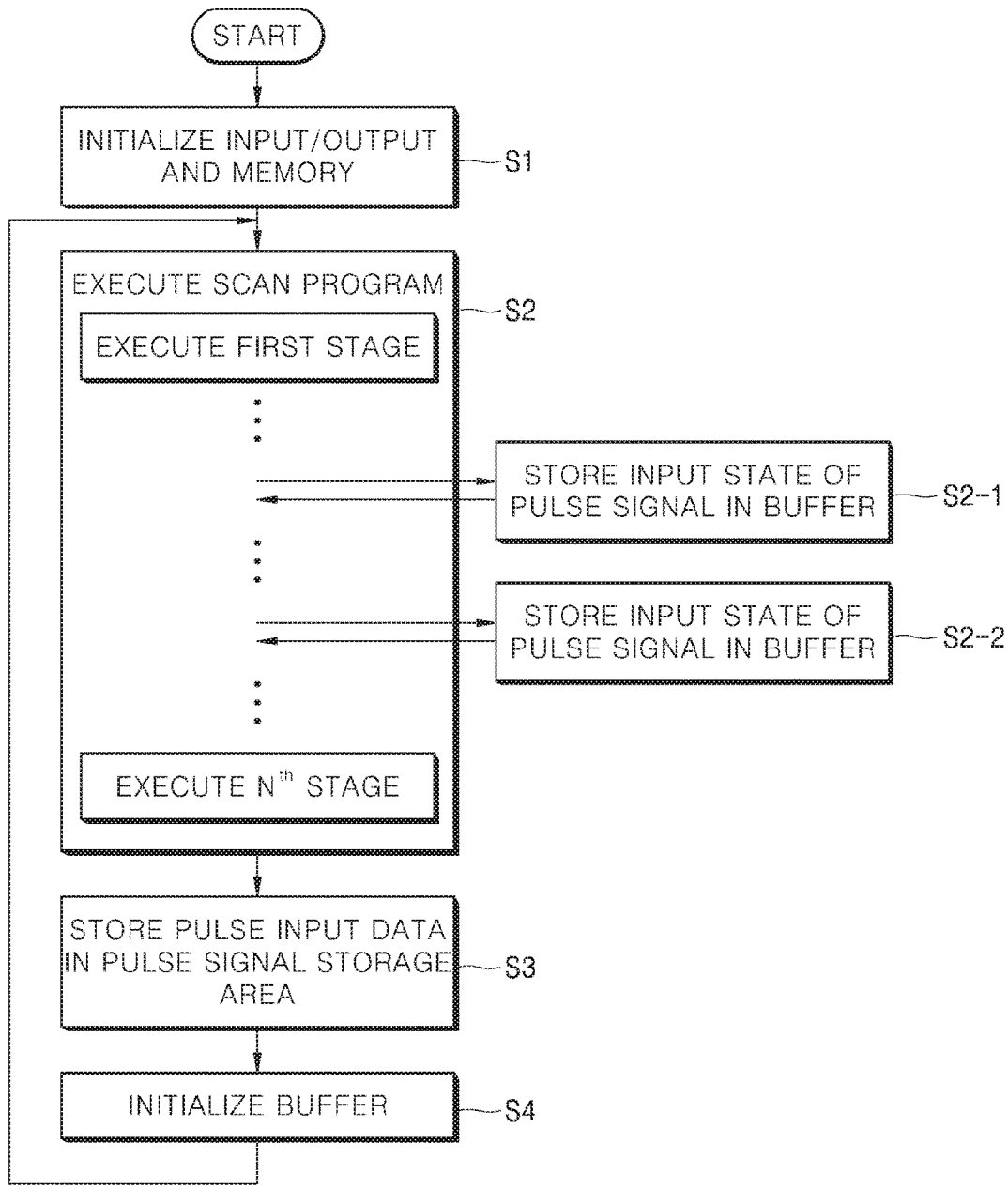
FIG. 2 is a flow chart illustrating a procedure in which the conventional PLC device provided with the pulse signal input circuit recognizes a pulse signal.
Figure 3:
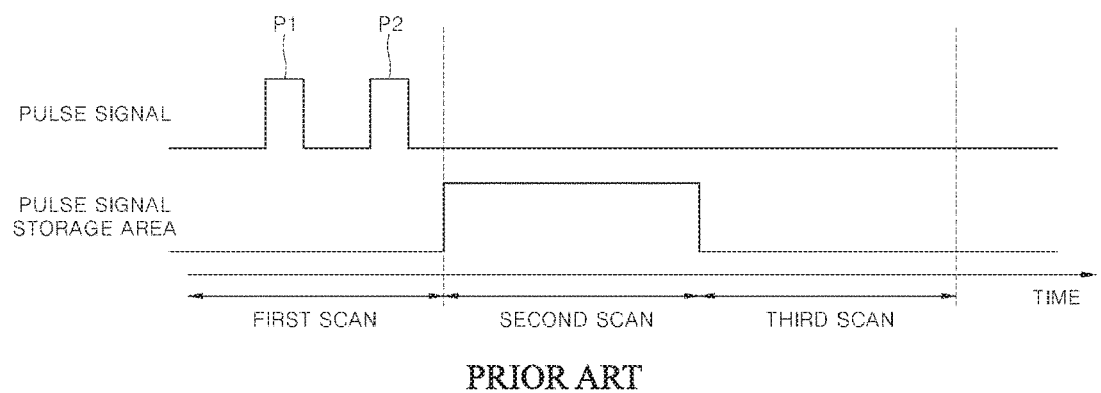
FIG. 3 is a timing diagram between a pulse signal being input for a scan time and pulse input data stored at a pulse signal storage area.

The above and other objects, features, and advantages of the present disclosure will be described in detail with reference to the accompanying drawings, and therefore, the technical spirit of the present disclosure can be easily implemented by those skilled in the art. Also, in the following description of the present disclosure, if a detailed description of the known related art is determined to obscure the gist of the present disclosure, the detailed description thereof will be omitted. Hereinafter, preferred embodiments according to the present disclosure will be described in detail with reference to the accompanying drawings. In the drawing, the same reference numeral refers to the same or similar component.

Figure 4:
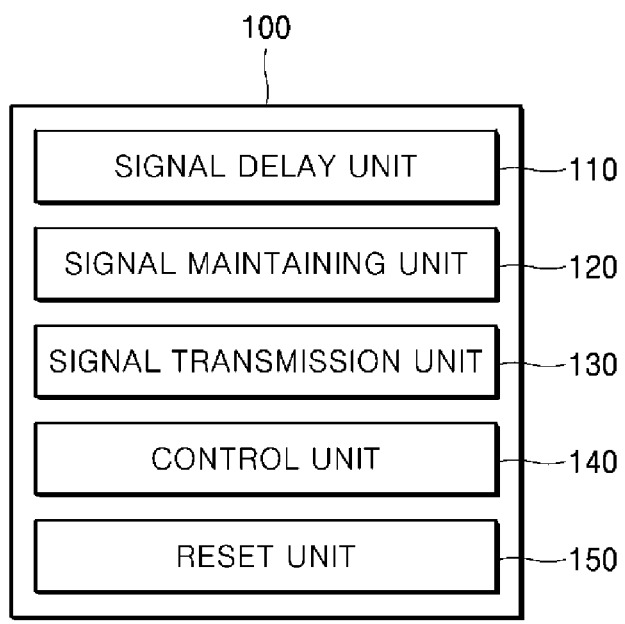
FIG. 4 is a diagram illustrating a configuration of an apparatus for recognizing a pulse signal according to one embodiment of the present disclosure.
Figure 5:
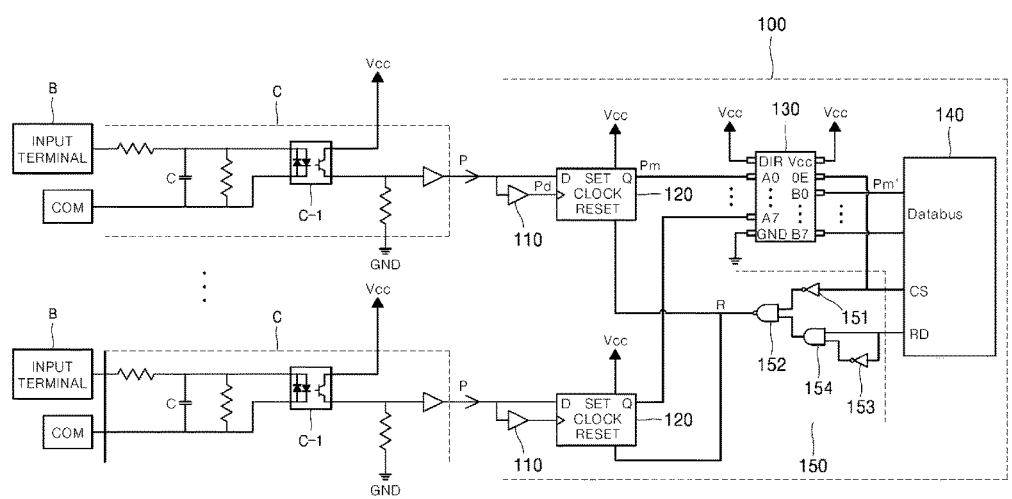
FIG. 5 is a diagram illustrating circuit diagrams of the apparatus for recognizing a pulse signal and a pulse signal input circuit according to one embodiment of the present disclosure.

FIG. 4 is a diagram illustrating a configuration of an apparatus 100 for recognizing a pulse signal according to one embodiment of the present disclosure, and FIG. 5 is a diagram illustrating circuit diagrams of the apparatus 100 for recognizing a pulse signal and a pulse signal input circuit C according to one embodiment of the present disclosure.

Referring to FIGS. 4 and 5, the apparatus 100 for recognizing a pulse signal according to one embodiment of the present disclosure may be connected to the pulse signal input circuit C of a PLC device to recognize a pulse signal that is input to an input terminal B for a scan time.

More particularly, the pulse signal input circuit C may maintain a non-conducting state using an optical coupler C-1 and then convert a pulse signal into a complementary metal-oxide semiconductor (CMOS) level when the pulse signal is input to the input terminal B for the scan time, thereby outputting the converted pulse signal to the apparatus 100 for recognizing a pulse signal.

Here, the scan time refers to a time in which a micron process unit (MPU) of the PLC device begins to execute a scan program, which is programmed by a user, to terminate the execution of the scan program. That is, the MPU of the PLC device performs the scan program one time for the scan time, and then infinitely repetitively performs the scan program.

To recognize a pulse signal being input for a pulse time, the apparatus 100 for recognizing a pulse signal includes a signal delay unit 110, a signal maintaining unit 120, a signal transmission unit 130, a control unit 140, and a reset unit 150.

The signal delay unit 110 may delay a pulse signal P, which is input for a scan time, for a preset delay time to output the pulse signal P as a pulse delay signal Pd.

More particularly, the signal delay unit 110 may delay and output the pulse delay signal Pd, which has a pulse width the same as that of the pulse signal P, by the preset delay time prior to a time in which the pulse signal P is input. Here, the preset delay time may be less than the pulse width of the pulse signal P. However, the present disclosure is not limited thereto and the preset delay time may be greater than the pulse width of the pulse signal P.

The signal delay unit 110 according to one embodiment of the present disclosure may be a buffer gate.

Figure 6:
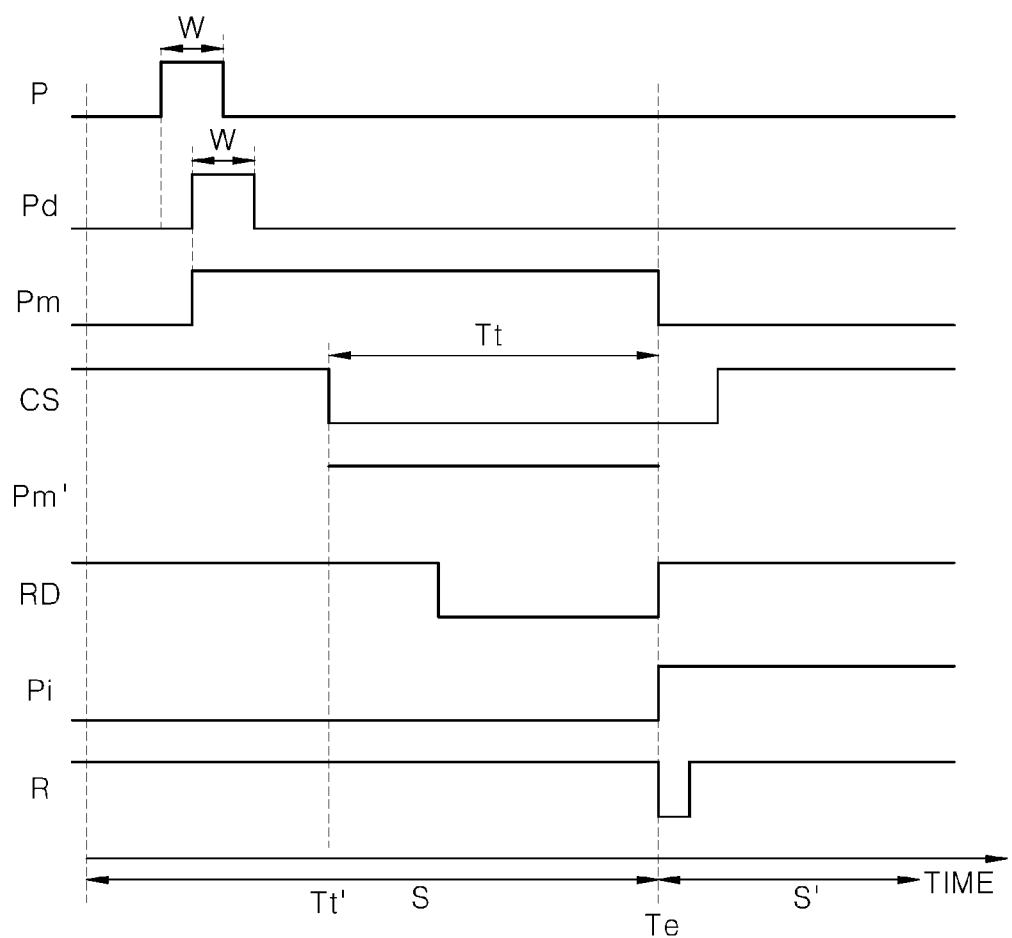
FIG. 6 is a timing diagram of input/output signals between configurations of the apparatus for recognizing a pulse signal according to one embodiment of the present disclosure.

FIG. 6 is a timing diagram of input/output signals between configurations of the apparatus 100 for recognizing a pulse signal according to one embodiment of the present disclosure.

Referring to FIG. 6, the signal delay unit 110 may receive the pulse signal P being input to the apparatus 100 for recognizing a pulse signal for a scan time S, and may output the pulse delay signal Pd having a pulse with W the same as that of the pulse signal P.

At this point, the signal delay unit 110 may output the pulse delay signal Pd at a time which is delayed by a preset delay time Td with respect to a time at which the pulse signal P is input.

Thereafter, the signal maintaining unit 120 may maintain the pulse signal P, which is input for the scan time S, to output the maintained pulse signal P as a pulse maintaining signal Pm.

More particularly, when receiving the pulse delay signal from the signal delay unit 110, the signal maintaining unit 120 may maintain the pulse signal P, which is input for the scan time S, to output the maintained pulse signal P as the pulse maintaining signal Pm.

Meanwhile, the signal maintaining unit 120 according to one embodiment of the present disclosure may be a D flip-flop. When the signal maintaining unit 120 is a D flip-flop, it respectively receives the pulse signal P and the pulse delay signal Pd through a signal input terminal D and a clock terminal CLOCK, and outputs the pulse maintaining signal Pm through a signal output terminal Q.

With reference to a truth table of the D flip-flop described in the following Table 1, the signal maintaining unit 120 will be described in detail.

TABLE 1

| INPUT | | | | OUTPUT |
|---|---|---|---|---|
| SET | RESET | CLOCK | DATA(D) | Q |
| H | H | ↗ | H | H |
| H | H | ↗ | L | L |
| H | H | L | X | No Variance |
| H | H | H | X | No Variance |
| H | H | ↘ | X | No Variance |
| H | L | X | X | L |

The pulse signal P of a high level H is input to the signal input terminal D of the signal maintaining unit 120, and, after the preset delay time Td from a time when the pulse signal P is input, the pulse delay signal Pd changing from a low level L to a high level H is input to the clock terminal CLOCK.

As shown in Table 1 with respect to the truth table of the D flip-flop, the signal maintaining unit 120 outputs a signal, which is input to the signal input terminal D at a time when a rising edge is input to the clock terminal CLOCK, to the signal output terminal Q, and maintains the signal until a signal of a low level L is input to the reset terminal RESET.

Consequently, when the pulse signal P is input to the apparatus 100 for recognizing a pulse signal, the signal maintaining unit 120 outputs the pulse maintaining signal Pm of a high level H to the signal output terminal Q.

That is, even when the pulse signal P is input a plurality of times to the apparatus 100 for recognizing a pulse signal for the scan time S, the signal maintaining unit 120 outputs the pulse maintaining signal Pm of a high level H from a time point when the pulse signal P is first input.

Through such an operation, the signal maintaining unit 120 may maintain and output the pulse signal P, which is input for the scan time S, as the pulse maintaining signal Pm, thereby maintaining an input state of the pulse signal P, which is input for a time shorter than the scan time S, up to a time point at which the scan time S is terminated.

The signal transmission unit 130 may receive the pulse maintaining signal Pm from the signal maintaining unit 120, and transmit the pulse maintaining signal Pm, which is input, to the control unit 140 based on a transmission control signal CS.

That is, the signal transmission unit 130 may serve to transmit a signal by outputting a signal the same as the input signal based on the transmission control signal CS.

Here, the transmission control signal CS is a signal which is output from the control unit 140 to the signal transmission unit 130 before a preset transmission time Tt from an end time point Te of the scan time S. Hereinafter, it will be described that a time point before the preset transmission time Tt from the end time point Te of the scan time S is a transmission time point Tt'.

Meanwhile, the signal transmission unit 130 according to one embodiment of the present disclosure may be a bus transceiver. When the signal transmission unit 130 is a bus transceiver, it respectively receives the pulse maintaining signal Pm and the transmission control signal CS through a signal input terminal A0 and an output enable terminal OE, and outputs the pulse maintaining signal Pm through a signal output terminal BO.

With reference to a truth table of the bus transceiver described in the following Table 2, the signal transmission unit 130 will be described in detail.

TABLE 2

| INPUT | | INPUT/OUTPUT | |
|---|---|---|---|
| DIR | OE | An | Bn |
| H | L | INPUT | B = A |
| X | H | Z | Z |

Before receiving the transmission control signal CS of a high level H from the control unit 140 through the output enable terminal OE, the signal transmission unit 130 does not transmit the pulse maintaining signal Pm, which is input to the signal input terminal AO, to the signal output terminal BO.

Thereafter, the signal transmission unit 130 receives the transmission control signal CS of a low level L from the control unit 140 through the output enable terminal OE at the transmission time point Tt', and outputs the pulse maintaining signal Pm, which is input to the signal input terminal AO, to the signal output terminal BO.

A pulse maintaining signal Pm', which is output from the signal transmission unit 130 to the control unit 140 by receiving the transmission control signal CS of a low level L from the control unit 140, is output to the control unit 140 until the transmission control signal CS of a high level H is input to the output enable terminal OE from the control unit 140.

As described above, to receive the pulse maintaining signal Pm from the signal transmission unit 130, the control unit 140 outputs the transmission control signal CS of a low level L to the output enable terminal OE at the transmission time point Tt'.

At this point, the control unit 140 may receive the pulse maintaining signal Pm through a data bus, and may store the pulse maintaining signal Pm', which is read from the data bus and is transmitted, in a pulse signal storage area as pulse input data Pi.

For this, the control unit 140 may output a storing control signal RD to store the pulse maintaining signal Pm', which is transmitted, in the pulse signal storage area as the pulse input data Pi.

More particularly, to receive the pulse maintaining signal Pm, the control unit 140 may output the storing control signal RD of a low level L after outputting the transmission control signal CS of a low level L, and then may output the storing control signal of a high level H at an end time point Te of the scan time S.

The control unit 140 stores the pulse maintaining signal Pm', which is transmitted at a time point when the storing control signal RD of a high level H is output, in the pulse signal storage area as the pulse input data Pi.

Through such an operation, the control unit 140 may store the pulse maintaining signal Pm', which is transmitted at the end time point Te of the scan time S, in the pulse signal storage area as the pulse input data Pi, thereby recognizing the pulse signal P without suspending the scan program whenever the pulse signal P is input.

Meanwhile, after storing the transmitted pulse maintaining signal Pm' as the pulse input data Pi, the control unit 140 outputs the transmission control signal CS of a high level H to the output enable terminal OE of the signal transmission unit 130 so as to block an output of the signal transmission unit 130.

At this point, the transmission control signal CS and the storing control signal RD, which are output from the control unit 140, may be output to the reset unit 150, which will be described below, in addition to the signal transmission unit 130.

After the pulse input data Pi is stored in the pulse signal storage area, the reset unit 150 may output a reset signal R based on the transmission control signal CS and the storing control signal RD, thereby resetting an output of the signal maintaining unit 120.

For this, the reset unit 150 according to one embodiment of the present disclosure may include a first NOT gate 151, a NAND gate 152, a second NOT gate 153, and an AND gate 154.

By describing a circuit connection of such a reset unit 150, the first NOT gate 151 receives the transmission control signal CS and inverts and outputs a signal level thereof to the NAND gate 152. By describing a circuit connection of such a reset unit 150, the first NOT gate 153 receives the transmission control signal CS and inverts and outputs a signal level thereof to the NAND gate 154.

The AND gate 154 receives and performs an AND operation on the storing control signal RD and an output signal of the second NOT gate 153 to output the operation result to the NAND gate 152. Lastly, the NAND gate 152 receives and performs a NAND operation on outputs of the first NOT gate 151 and the AND gate 154 to output the operation result to the reset terminal RESET of the signal maintaining unit 120 as the reset signal R.

Figure 7:
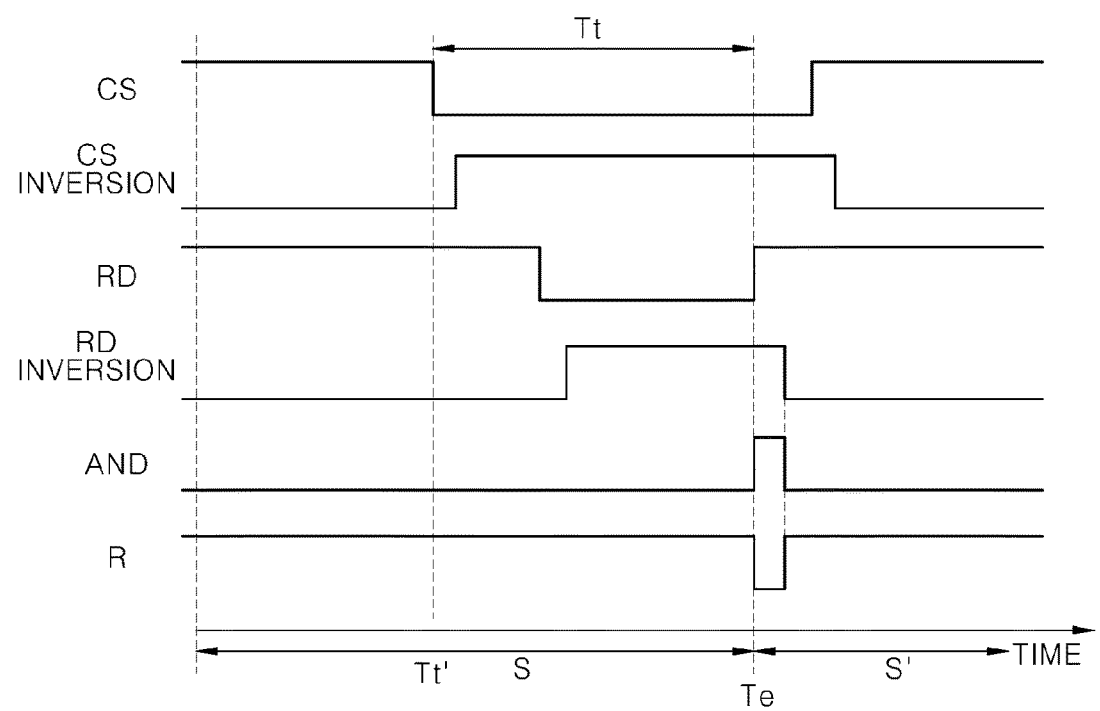
FIG. 7 is a timing diagram of input/output signals of a reset unit according to one embodiment of the present disclosure.

FIG. 7 is a timing diagram of input/output signals of the reset unit 150 according to one embodiment of the present disclosure.

Referring to FIG. 7, the first NOT gate 151 receives the transmission control signal CS of a low level L from the control unit 140 at the transmission time point Tt' and inverts a signal level of the transmission control signal CS to output the transmission control signal CS of the inverted signal level to the NAND gate 152. At this point, as shown in FIG. 7, the transmission control signal CS, which is inverted through the first NOT gate 151, is delayed for a predetermined time according to a delay characteristic of the first NOT gate 151 and then is output to the NAND gate 152.

As described above, after outputting the transmission control signal CS of a low level L, the control unit 140 outputs the storing control signal RD of a low level L. At this point, the second NOT gate 153 and the AND gate 154 receive the storing control signal RD of a low level L. The second NOT gate 153 receives the storing control signal RD of a low level L from the control unit 140 and inverts a signal level of the storing control signal RD to output the storing control signal RD of the inverted signal level to the AND gate 154. At this point, as shown in FIG. 7, the storing control signal RD, which is inverted through the second NOT gate 153, is delayed for a predetermined time according to a delay characteristic of the second NOT gate 153 and then is output to the AND gate 154.

Through such an operation, the AND gate 154 outputs a signal of a low level L to the NAND gate 152 until the end time point Te of the scan time S, at which the storing control signal RD of a high level is output from the control unit 140, and the NAND gate 152 outputs the reset signal R of a high level H to the reset terminal RESET of the signal maintaining unit 120 until the end time point Te of the scan time S.

Consequently, the signal maintaining unit 120 receives a signal of a high level H through the reset terminal RESET until the end time point Te of the scan time S and outputs the pulse maintaining signal Pm according to the signals input to the signal input terminal D and the clock terminal CLOCK as shown in the truth table.

Thereafter, to store the transmitted pulse maintaining signal Pm' in the pulse signal storage area as the pulse input data Pi, the control unit 140 outputs the storing control signal RD of a high level H at the end time point Te of the scan time S, and then outputs the transmission control signal CS of a high level H.

The AND gate 154 receives the storing control signal RD of a high level H and the signal of a low level L, which is not yet inverted into a high level H in the second NOT gate 153, to output a signal of a high level H to the NAND gate 152.

The control unit 140 outputs the transmission control signal CS of a low level L at the end time point Te of the scan time S so that the first NOT gate 151 outputs a signal of a high level H to the NAND gate 152.

Consequently, the NAND gate 152 receives only the signal of a high level H at the end time point Te of the scan time S to perform the NAND operation so that it outputs a signal of a low level L as the reset signal R.

As shown in FIG. 6, the reset signal R of a low level L, which is output from the NAND gate 152 at the end time point Te of the scan time S, is input to the reset terminal RESET of the signal maintaining unit 120, thereby resetting an output thereof. Through such an operation, the signal maintaining unit 120 resets the output thereof after the scan time S is terminated and before the next scan time S' is begun so that it may output a pulse maintaining signal when a pulse signal is input for the next scan time S'.

Afterward, the MPU of the PLC device may execute a scan program by updating the scan program, which is scheduled to be executed for the next scan time S', with the scan input data Pi stored in the scan signal storage area for the scan time S.

Figure 8:
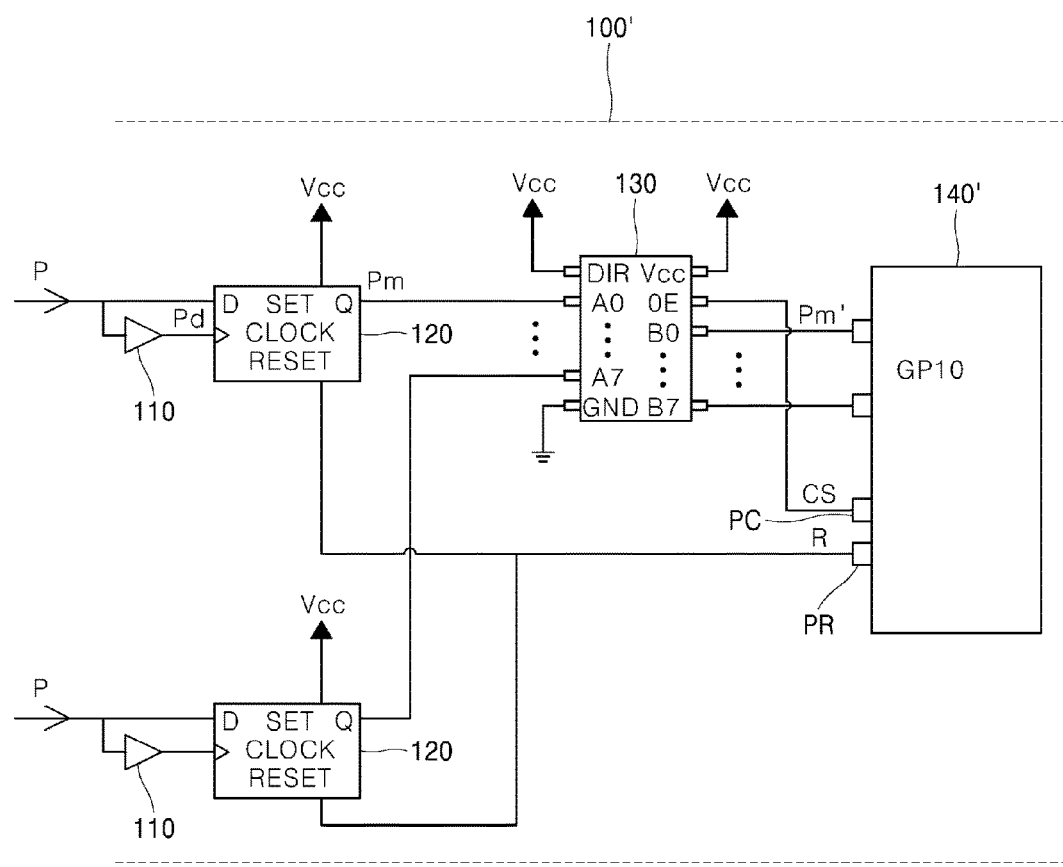
FIG. 8 is a diagram illustrating a circuit diagram of an apparatus for recognizing a pulse signal according to another embodiment of the present disclosure.

FIG. 8 is a diagram illustrating a circuit diagram of an apparatus 100' for recognizing a pulse signal according to another embodiment of the present disclosure.

Referring to FIG. 8, a control unit 140' of the apparatus 100' for recognizing a pulse signal according to another embodiment of the present disclosure may receive the pulse maintaining signal Pm from the signal transmission unit 130 using a general purpose I/O (GPIO) port instead of the data bus.

Consequently, the control unit 140' according to another embodiment of the present disclosure may be provided with a reset output port PR and a transmission control output port PC which correspond to the GPIO port. More particularly, the reset output port PR provided at the control unit 140' may be connected to the reset terminal RESET of the signal maintaining unit 120 to output the reset signal R, thereby resetting an output of the signal maintaining unit 120.

Through such an operation, the apparatus 100' for recognizing a pulse signal according to another embodiment of the present disclosure may reset the output of the signal maintaining unit 120 at the end time point Te of the scan time S without having the reset unit 150.

Also, the transmission control output port PC provided at the control unit 140' may be connected to the output enable terminal OE of the signal transmission unit 130 to output the transmission control signal CS, thereby receiving the pulse maintaining signal Pm from the signal transmission unit 130.

Figure 9:
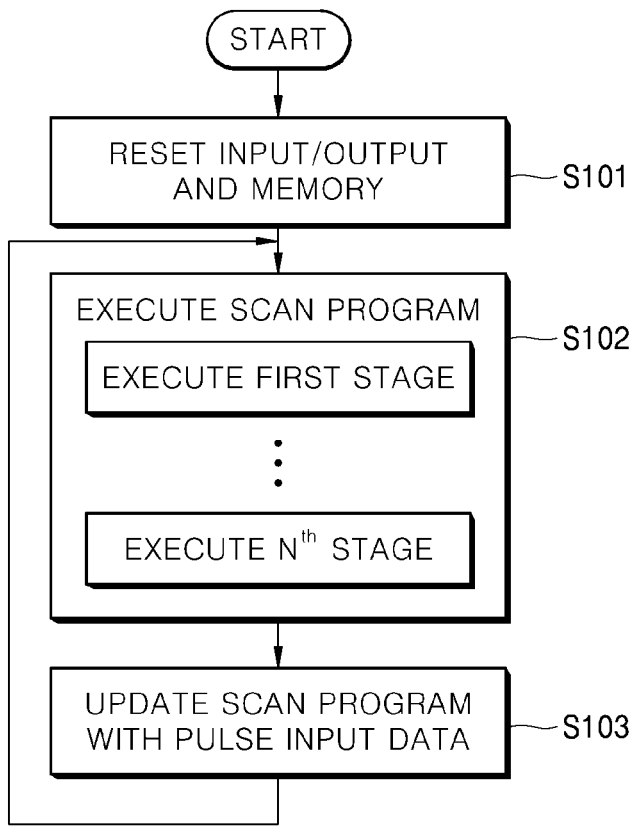
FIG. 9 is an operation flow chart of a programmable logic controller (PLC) device provided with the apparatus for recognizing a pulse signal according to one embodiment of the present disclosure.

FIG. 9 is an operation flow chart of the PLC device provided with the apparatus 100 for recognizing a pulse signal according to one embodiment of the present disclosure.

Referring to FIG. 9, before repetitively performing a scan, the MPU of the PLC device firstly resets inputs/outputs and a memory in Operation S101. Thereafter, the MPU executes a scan program from a first stage to an $n^{th}$ stage, thereby completing one time scan in Operation S102. Even when a pulse signal is input for a scan time at which the MPU executes a scan program, the MPU continuously executes the scan program from the first stage to the $N^{th}$ stage without suspending the scan program in the middle of the execution.

At this point, the signal delay unit of the apparatus for a pulse signal delays a pulse signal, which is input for the scan time, to output the delayed pulse signal as a pulse delay signal, and, when the pulse delay signal is input, the signal maintaining unit maintains and outputs the input pulse signal as a pulse maintaining signal until an end time point of the scan time.

Thereafter, the signal transmission unit receives the transmission control signal from the control unit at a transmission time point and transmits the pulse maintaining signal, which is output from the signal maintaining unit, to the control unit, and the control unit outputs the storing control signal at the end time point of the scan to store the pulse maintaining signal, which is transmitted, in the pulse signal storage area as the pulse input data.

Lastly, the MPU updates a scan program, which is scheduled to be executed for a next scan time, with the pulse input data stored in the pulse signal storage area and completes one time scan in Operation S103.

As described above, when a pulse signal is input for the scan time, the PLC device provided with the apparatus 100 for a pulse signal may recognize the pulse signal without suspending the scan program, which is currently executed, to update a scan program, which is scheduled to be executed for the next scan time, with the recognized pulse signal.

Through such an operation, the present disclosure may maintain and output the pulse signal, which is input for the scan time, as the pulse maintaining signal so that an input state of a pulse signal, which is input for a time shorter than the scan time, may be maintained up to a time point at which the scan time is terminated.

Also, the present disclosure may store the pulse maintaining signal in the pulse signal storage area as the pulse input data at a termination time point of the scan time so that a pulse signal may be recognized without suspending of a scan program whenever the pulse signal is input.

It should be understood that various substitutions, modifications, and alternations can be derived by those skilled in the art without departing from the technical spirit of the present disclosure and the present disclosure is not limited to the above described embodiments and the accompanying drawings.

What is claimed is:

1. An apparatus for recognizing a pulse signal, which is input to a programmable logic controller (PLC) for a scan time, comprising:
    a signal maintaining unit configured to maintain and output the pulse signal, which is input for the scan time, as a pulse maintaining signal;
    a signal transmission unit configured to receive the pulse maintaining signal from the signal maintaining unit and transmit the input pulse maintaining signal based on a transmission control signal;
    a control unit configured to output the transmission control signal to the signal transmission unit to receive the pulse maintaining signal, and store the received pulse maintaining signal in a pulse signal storage area as pulse input data; and
    a signal delay unit configured to delay the pulse signal, which is input for the scan time, for a preset delay time and output the delayed pulse signal as a pulse delay signal,
    wherein the preset delay time is less than a pulse width of the pulse signal.

2. The apparatus of claim 1, wherein the control unit outputs the transmission control signal to the signal transmission unit before a preset transmission time from an end time point of the scan time, and a storing control signal at the end time point of the scan time.

3. The apparatus of claim 1, further comprising:
    a reset unit configured to output a reset signal, which resets an output of the signal maintaining unit, to the signal maintaining unit based on the transmission control signal and the storing control signal after the pulse input data is stored in the pulse signal storage area.

4. The apparatus of claim 1, wherein, when receiving the pulse delay signal, the signal maintaining unit maintains the pulse signal, which is input for the scan time, and outputs the maintained pulse signal as the pulse maintaining signal.

5. The apparatus of claim 1, wherein the pulse input data, which is stored in the pulse signal storage area for the scan time, is updated to the scan program at a start time point of a next scan time.

* * * * *